(12) United States Patent
Koyama et al.

(10) Patent No.: US 8,802,776 B2
(45) Date of Patent: Aug. 12, 2014

(54) EPOXY RESIN COMPOSITION, METHOD FOR PRODUCING COMPOSITE UNIT USING THE EPOXY RESIN COMPOSITION, AND COMPOSITE UNIT

(75) Inventors: Taichi Koyama, Tokyo (JP); Hironobu Moriyama, Tokyo (JP); Takashi Matsumura, Tokyo (JP); Takayuki Saito, Tokyo (JP)

(73) Assignee: Dexerials Corporation, Tokyo (JP)

( * ) Notice: Subject to any disclaimer, the term of this patent is extended or adjusted under 35 U.S.C. 154(b) by 222 days.

(21) Appl. No.: 13/517,415

(22) PCT Filed: Dec. 20, 2010

(86) PCT No.: PCT/JP2010/072883
§ 371 (c)(1),
(2), (4) Date: Jul. 24, 2012

(87) PCT Pub. No.: WO2011/078114
PCT Pub. Date: Jun. 30, 2011

(65) Prior Publication Data
US 2012/0281376 A1 Nov. 8, 2012

(30) Foreign Application Priority Data
Dec. 25, 2009 (JP) ................. P2009-294827

(51) Int. Cl.
*C08L 63/00* (2006.01)
*C08L 63/02* (2006.01)
*C08L 63/04* (2006.01)
*H05K 1/18* (2006.01)
*H01L 21/82* (2006.01)

(52) U.S. Cl.
USPC ............ 525/109; 257/E21.499; 257/E21.599; 361/762; 438/113; 438/118; 523/457; 523/458; 523/467

(58) Field of Classification Search
None
See application file for complete search history.

(56) References Cited

U.S. PATENT DOCUMENTS

| 2008/0063871 A1* | 3/2008 | Jung et al. ...................... 428/414 |
| 2010/0085723 A1* | 4/2010 | Furuta ........................... 361/807 |
| 2010/0330780 A1* | 12/2010 | Hwang et al. .................. 438/464 |

FOREIGN PATENT DOCUMENTS

| JP | 10-330693 A | * | 12/1998 |
| JP | 2006-233084 A | * | 9/2006 |
| JP | 2006-245554 A | * | 9/2006 |
| JP | 2007-231091 | | 9/2007 |
| JP | 2008-98250 A | * | 4/2008 |
| JP | 2008-143967 A | * | 6/2008 |
| JP | 2008-300862 A | | 12/2008 |
| JP | 2009-267237 | | 11/2009 |

OTHER PUBLICATIONS

CAS registry No. 866527-61-9 for SG 80H acrylonitrile-dimethylacrylamide-ethyl acrylate-glycidyl methacrylate rubber, 2014, one page.*
International Search Report w/translation from PCT/JP2010/072883 dated Feb. 22, 2011 (3 pages).

* cited by examiner

Primary Examiner — Robert Sellers
(74) Attorney, Agent, or Firm — Osha Liang LLP (57) ABSTRACT

An epoxy resin composition having excellent connection reliability and transparency, a method for manufacturing a composite unit using the epoxy resin composition, and the composite unit, are disclosed. The manufacturing method includes an attaching step of attaching an epoxy resin composition (2) containing a novolak phenolic curing agent, an acrylic elastomer composed of a copolymer containing dimethylacrylamide and hydroxylethyl methacrylate, an epoxy resin and not less than 5 parts by weight to not more than 20 parts by weight of an inorganic filler to 100 parts by weight of the epoxy resin, to a printed circuit board (1) in the form of a sheet. The manufacturing method also includes a temporary loading step of temporarily loading a semiconductor chip (3) and capacitors (4a) to (4d) on the epoxy resin composition (2) and an ultimate pressure bonding step of pressuring the semiconductor chip (3) and capacitors (4a) to (4d) by a thermal bonding head (20) in situ to ultimately pressure bond the semiconductor chip (3) and capacitors (4a) to (4d).

16 Claims, 8 Drawing Sheets

EPOXY RESIN COMPOSITION, METHOD FOR PRODUCING COMPOSITE UNIT USING THE EPOXY RESIN COMPOSITION, AND COMPOSITE UNIT

TECHNICAL FIELD

This invention relates to an epoxy resin composition, used for packaging an electronic component on a printed circuit board, a method for producing a composite unit using the epoxy resin composition, and to the composite unit.

The present application asserts priority rights based on Japanese Patent Application 2009-294827 filed in Japan on Dec. 25, 2009, Japanese Patent Application 2010-169711 filed in Japan on Jul. 28, 2010 and on Japanese Patent Application 2010-269421 filed in Japan on Dec. 2, 2010. The total contents of disclosure of the Patent Applications of the senior filing dates are to be incorporated by reference into the present Application.

BACKGROUND ART

In the technique of packaging a chip component on a printed circuit board, a method which uses a solder bump and a method which connects a bump and a substrate terminal using one out of an electrically conductive adhesive, an anisotropic conductive film (ACF) and a non-conductive film (NCF), is currently in use. Of these methods, the connecting method which uses the ACF or NCF is not in need of an underfill process which is necessary in case of using the solder bump or the electrically conductive adhesive. The reason is that, in the connecting method which uses the ACF or the NCF, a chip component is packaged after it is temporarily attached by pressure bonding to the substrate. Hence, the connecting method which uses the ACF or NCF is used for larger numbers of semiconductor packages employed in electronic equipment (see Patent Publication 1 by way of an example).

Recently, not the mechanical contact with the ACF but rather the connection by metallic bond with the NCF is thought to be desirable in view of bump-land connection reliability. However, since the conventional NCF uses an epoxy resin composition which uses imidazoles as a curing agent, the reaction of curing initiation becomes faster, with the consequence that sufficient connection reliability may not be achieved.

On the other hand, the NCF is thought to be desirably transparent in view of ease in visually checking an alignment mark at the time of bonding the film on the printed circuit board. However, if a curing agent other than imidazoles is used, it is difficult to obtain a transparent epoxy resin composition, thus occasionally leading to a turbid composition. It is thought that a sea island structure unit, formed in a binder, may be responsible for the composition thus becoming turbid.

RELATED TECHNICAL PUBLICATION

Patent Publication

Patent Publication 1: Japanese Laid-Open patent 2006-245554

DISCLOSURE OF THE INVENTION

Problem to be Solved by the Invention

The present invention has been proposed in view of the above depicted status of the art. It is an object of the present invention to provide an epoxy resin composition exhibiting high connection reliability and transparency, a method for producing a composite unit using the epoxy resin composition, and the composite unit.

Means to Solve the Problem

The present inventors conducted a variety of investigations to accomplish the above object. As a result, the present inventors have found that high connection reliability may be obtained with the use of a novolak curing agent, and that excellent transparency may be obtained by using a copolymer containing dimethyl acrylamide and hydroxyethyl methacrylate as an acrylic elastomer.

An epoxy resin composition according to the present invention contains a novolak phenolic curing agent, an acrylic elastomer, an epoxy resin and an inorganic filler, wherein the acrylic elastomer is a copolymer containing dimethylacrylamide and hydroxyethyl methacrylate, and wherein the inorganic filler is contained in an amount of not less than 5 parts by weight to not more than 20 parts by weight to 100 parts by weight of the epoxy resin.

A method for producing a composite unit according to the present invention includes an attaching step of attaching an epoxy resin composition containing a novolak phenolic curing agent, an acrylic elastomer composed of a copolymer containing dimethylacrylamide and hydroxyethyl methacrylate, an epoxy resin, and not less than 5 parts by weight to not more than 20 parts by weight of an inorganic filler to 100 parts by weight of the epoxy resin, on a substrate of a printed circuit board in the form of a sheet, a temporary loading step of temporarily loading an electronic component on the epoxy resin composition, and an ultimate pressure bonding step of pressuring the electronic component by a thermal bonding head in situ to ultimately pressure bond the electronic component.

A composite unit according to the present invention is composed by an electronic component and a printed circuit board bonded together by an epoxy resin composition containing a novolak phenolic curing agent, an acrylic elastomer composed of a copolymer containing dimethylacrylamide and hydroxyethyl methacrylate, an epoxy resin, and an inorganic filler. The inorganic filler is contained in an amount not less than 5 parts by weight to not more than 20 parts by weight to 100 parts by weight of the epoxy resin.

Beneficent Effect of the Invention

According to the present invention, in which a novolak phenolic curing agent is used, the reaction for curing initiation is sluggish, thus leading to excellent connection reliability. On the other hand, a copolymer containing dimethylacrylamide and hydroxyethyl methacrylate, used as the acrylic elastomer, is excellent in compatibility with respect to the epoxy resin, thus leading to excellent transparency.

PREFERRED MODE FOR CARRYING OUT THE INVENTION

A concrete mode of the present invention, referred to below as the 'present mode', will now be described in detail with reference to the drawings in the following sequence:
1. Epoxy resin composition; and
2. Method for producing a composite unit.

<1. Epoxy Resin Composition>

An epoxy resin composition according to the present mode contains an epoxy resin, an acrylic elastomer, a novolak phenolic curing agent and an inorganic filler.

The epoxy resin may be enumerated by a glycidyl ether epoxy resin and a glycidylamine epoxy resin compatible with the acrylic elastomer. Concrete examples of the glycidyl ethers may include glycidyl ethers of phenols, such as bisphenol-A, bisphenol-F, resorcinol, phenol novolak or cresol novolak, and glycidyl ethers of alcohols, such as butane diol, polyethylene glycol or polypropyrene glycol. These epoxy resins may be used either singly or in combination.

The acrylic elastomer is preferably a copolymer containing, an acrylate containing hydroxyl groups and acrylamide as monomers. In particular, a copolymer containing dimethyl acrylamide and hydroxyethyl methacrylate (monomers) is preferred. In case the acrylic elastomer is a copolymer containing dimethylacrylamide and hydroxyethyl methacrylate as monomers, the acrylic elastomer is excellent in compatibility to the epoxy resin, thereby allowing facilitated recognition of alignment marks as later explained. The ratio of contents of dimethyl acrylamide to hydroxyethyl methacrylate is preferably 5:1 to 3:1. With this range of the ratio of contents, it becomes possible to improve compatibility of the acrylic elastomer with respect to the epoxy resin.

The ratio of contents of the acrylic elastomer to the epoxy resin is preferably 20 to 40 parts by weight of the acrylic elastomer to 100 parts by weight of the epoxy resin. With the contents of the acrylic elastomer of 20 to 40 parts by weight to those of the epoxy resin of 100 parts by weight, connection reliability may be improved, as will be explained subsequently. Note that the acrylic elastomer may also be a random copolymer containing ethyl acrylate, butyl acrylate, acrylonitrile or glycidyl methacrylate as other monomers.

The novolak phenolic curing agent may be enumerated by novolak phenolic resins obtained on reacting phenols, such as phenol or alkylphenol, with aldehydes, such as formaldehyde or p-formaldehyde, or modified resins thereof. These resins may be used either alone or as a mixture.

The ratio of the amounts of the novolak phenolic curing agent to the epoxy resin is preferably 0.7 to 1.2 equivalent to 1 equivalent of the epoxy group of the epoxy resin. In case the ratio of the curing agent is less than 0.7 equivalent or more than 1.2 equivalent to 1 equivalent of the epoxy resin, curing is imperfect, such that curing properties obtained may be non-optimum.

A curing accelerator may be contained in the epoxy resin composition of the present mode. Concrete examples of the curing accelerator may include imidazoles, such as 2-methyl imidazole, 2-ethyl imidaole or 2-ethyl-4-methyl imidazole, tertiary amines, such as 2-(dimethylaminomethyl)phenol, 1,8-diaza-bicyclo(5,4,0) undecene-7, phosphines, such as triphenol phosphine, and metal compounds, such as tin octylate. It is noted that the curing accelerator is added in an amount of 0.1 to 5.0 parts by weight to 100 parts by weight of the epoxy resin.

The inorganic filler may be enumerated by, for example, silica, talcum, titanium oxide, calcium carbonate and magnesium oxide. The contents of the inorganic filler are effective to suppress the resin from becoming fluidized as well as to improve connection reliability.

The amount of the inorganic filler is preferably not less than 5 parts by weight and not more than 20 parts by weight to 100 parts by weight of the epoxy resin. With the amount of not less than 5 parts by weight to not more than 20 parts by weight of the inorganic filler to 100 parts by weight of the epoxy resin, it is possible to maintain connection reliability as well as transparency.

A silane coupling agent may be contained in the epoxy resin composition of the present mode. As the silane coupling agent, an epoxy-based silane coupling agent is preferably used. In this case, the epoxy resin composition may be improved in tight bonding performance and in connection reliability.

In the epoxy resin composition of the present mode, a variety of additives, such as titanates or organic resin fillers, may be added as other components.

In the epoxy resin composition of the present mode, the above mentioned components are mixed evenly and molded to an NCF (Non-Conductive Film). For example, the NCF may be obtained by dissolving the above mentioned components in a solvent such as toluene, xylene, acetone, methylethylketone or methylisobutylketone to form a solution, coating the so formed solution on a support having a release function, such as film or paper sheet, and allowing the solvent to be volatilized.

<2. Method for Producing a Composite Unit>

The method for producing a composite unit using the NCF formed of the above mentioned epoxy resin composition will now be described. The method for producing the composite unit shown by way of a concrete example is a method consisting in packaging a plurality of electronic components of differing heights on a printed circuit board in lump using the NCF. The method is termed an EBS (Elasticity Bonding System) method.

This EBS method includes an attaching step, a temporary loading step and an ultimate pressure bonding step. The attaching step attaches an NCF on the printed circuit board, and the temporary loading step temporarily loads the electronic components on the NCF. The ultimate pressure bonding step ultimately pressure bonds the electronic components by pressuring the entire electronic components-NCF assembly in situ, by a thermal pressure bonding head placed on top of the entire printed circuit board. These steps will now be explained in order.

Figure 1A:
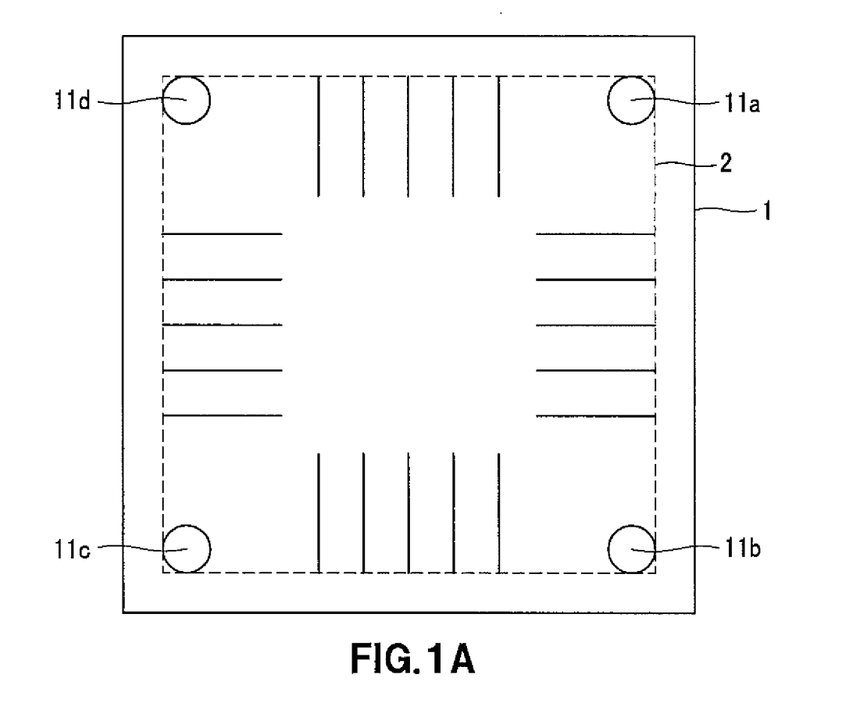
FIGS. 1A and 1B are a schematic top plan view and a schematic side view for illustrating the manner of the attaching step, respectively.
Figure 1B:
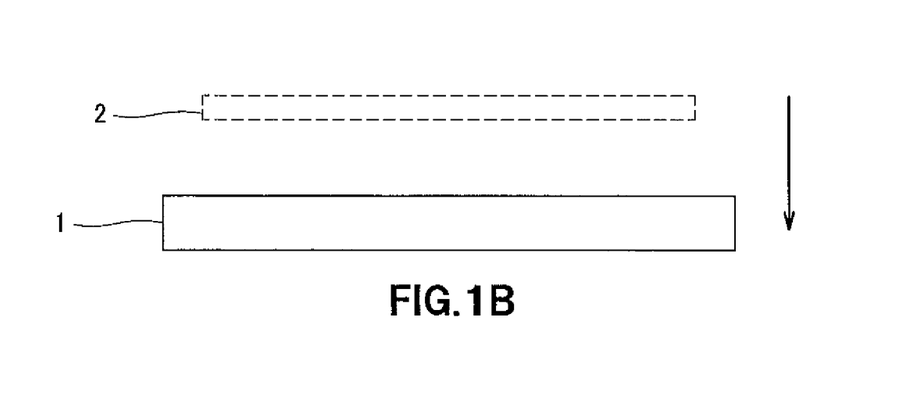

FIG. 1A depicts a top plan view of a printed circuit board 1 during the attaching step and FIG. 1B depicts a side view of the printed circuit board 1 during the attaching step. At the four corners of the printed circuit board 1, there are formed four alignment marks 11a to 11d used for position matching the electronic components. From the center area towards the outer rim of the printed circuit board 1, there is formed an interconnect pattern which is adapted for connection to bumps, not shown, of a semiconductor chip 3.

An NCF 2 is attached to an entire packaging area of the printed circuit board 1, as shown in FIG. 1A. Since the NCF is formed of the above mentioned epoxy resin composition, it is highly transparent and hence allows for facilitated recognition of the alignment marks 11a to 11d.

Figure 2A:
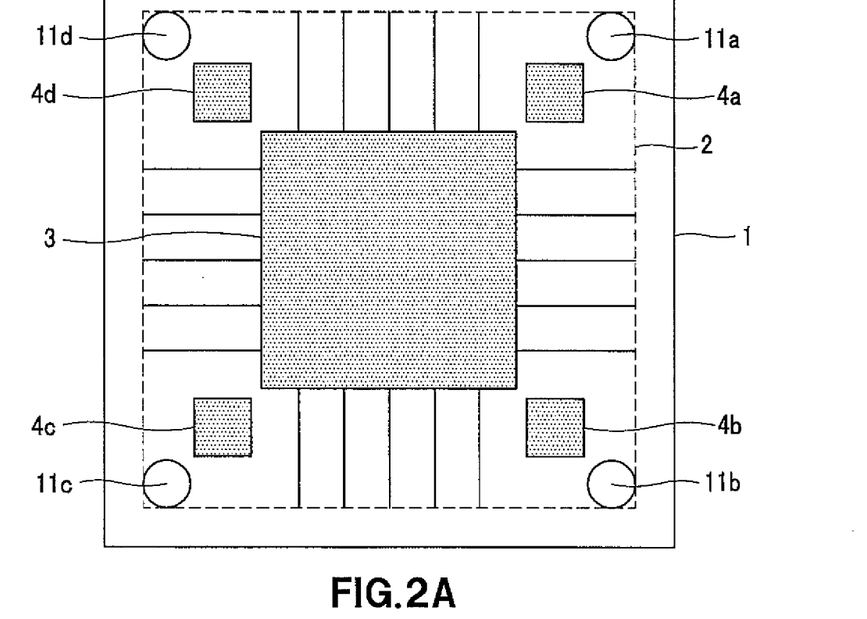
FIGS. 2A and 2B are a schematic top plan view and a schematic side view for illustrating the manner of the temporary loading process, respectively.
Figure 2B:
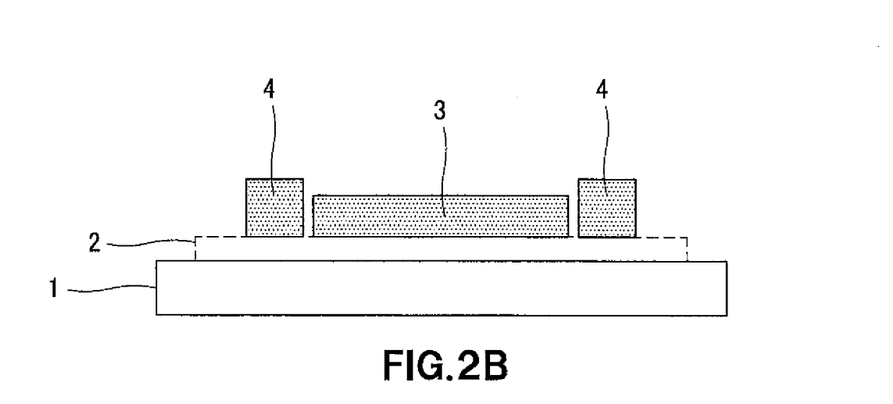

The electronic components are then temporarily loaded in position by a surface packager, using the alignment marks 11a to 11d as references, as shown in FIG. 2. FIGS. 2A and 2B depict a top plan view and a side view of the printed circuit board 1 during the temporary loading process, respectively. At this time, a semiconductor chip 3 and capacitors 4a to 4d, differing in height from the chip 3, are temporarily loaded, as shown in FIG. 2B.

The semiconductor chip 3 is temporarily loaded at the center of the printed circuit board 1 so that its bumps will be located on top of electrodes of an interconnect pattern of the printed circuit board. The capacitors 4a to 4d are temporarily loaded between the alignment marks 11a to 11d and the four corners of the semiconductor chip 3. As the bumps of the semiconductor chip 3, needle-shaped stud bumps or solder bumps, comprised of bumps with solder placed thereon, for example, may be used. As the solder bumps, composed by bumps and the solder placed thereon, bumps composed by the solder placed on copper pillars may preferably be used. As the electrodes provided on the printed circuit board 1, electrodes pre-coated with solder may be used.

Figure 3:
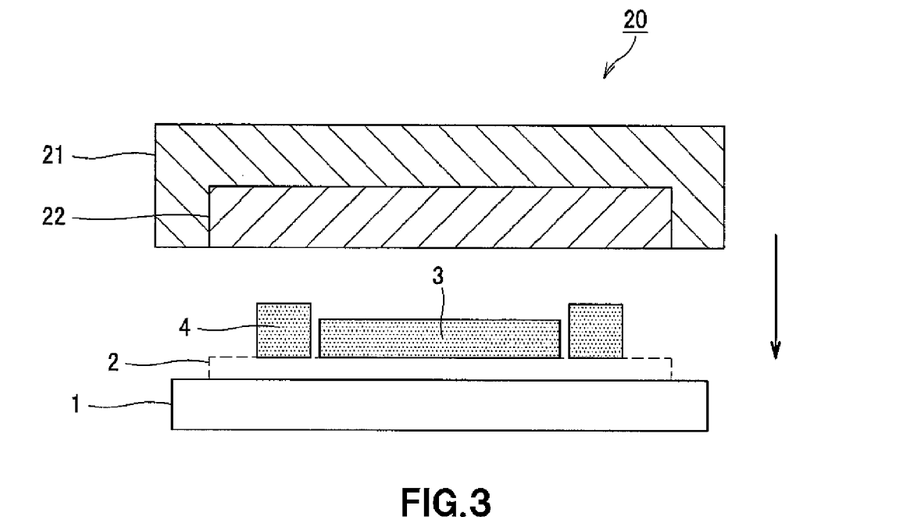
FIG. 3 is a schematic side view for illustrating the ultimate pressure bonding process.

The semiconductor chip 3 and the capacitors 4a to 4d are then ultimately pressure-bonded in lump, using a thermal pressure-bonding head 20, as shown in FIG. 3. The thermal pressure-bonding head 20 includes a main head member 21 of a pre-set metal, and a heater, not shown, arranged in the bulk of the main head member 21. A plate-shaped pressure bonding member 22, formed of an elastomer, is loaded for use as a thrust surface of the main head member 21 facing the printed circuit board 1.

The pressure bonding member 22 is arranged with its thrust surface in a level position. The thrust surface of the pressure bonding member 22 is formed to be commensurate with the NCF 2 in the packaging region of the printed circuit board 1. Since the top of each electronic component and the filet part of the adhesive at the time of thermal pressure bonding need to be pressured to an optimum pressure, the thickness of the pressure bonding member 22 is preferably set so as to be equal to or greater than the maximum thickness of the electronic components.

Although there is no particular limitation to the sorts of the elastomer of the pressure bonding member 22, it is preferred to use such elastomer that has rubber hardness not less than 40 and not more than 80 from the perspective of improving the connection reliability. The elastomer with the rubber hardness less than 40 is sometimes inferior in its pressuring against the electronic components while being inferior in initial resistance and in connection reliability. On the other hand, the elastomer with the rubber hardness greater than 80 is sometimes insufficient in its pressuring against the filet part while being inferior in connection reliability due to voids produced in the binding resin of the adhesive. Note that the standard of JISS6050 is to apply in connection with rubber hardness. As such elastomer, any of natural rubber or synthetic rubber may be used. Silicone rubber is preferably used from the perspective of resistance against heat as well as pressure.

For ultimate pressure bonding, the thrust surface of the thermal pressure-bonding head 20 is applied to the upper parts of the semiconductor chip 3 and the capacitors 4a to 4d, and the electronic component side is heated to a pre-set temperature, while the printed circuit board side is heated to a temperature higher than the pre-set temperature for the electronic component side. By so doing, the filet part around the electronic components may be heated sufficiently to prevent voids from being produced. Specifically, the heater of the thermal pressure-bonding head 20 is controlled so that the temperature of the pressure bonding member 22 will be approximately 100° C., while the heater of the substrate is controlled so that the temperature of the binding resin of the NCF will be approximately 200° C. The pressure applied during the ultimate pressure bonding is to be approximately 100N for each electronic component and is applied for ca. 15 seconds. The heater may be provided on the side the thermal pressure-bonding head 20 or a stage side (substrate side), whichever is desired.

Figure 4:
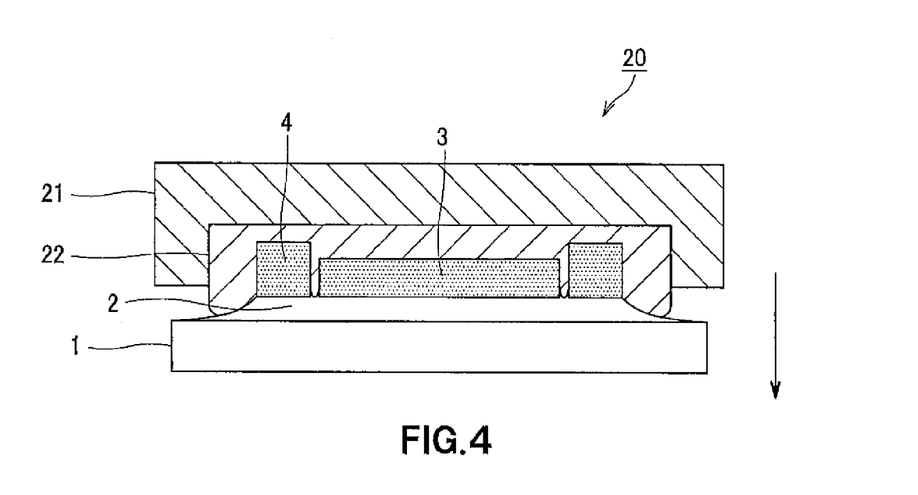
FIG. 4 is a schematic side view for illustrating the state of a composite unit in the ultimate pressure bonding process.

FIG. 4 shows the state of the semiconductor device in the course of the ultimate pressure bonding process. Referring to FIG. 4, pressuring is by the pressure bonding member 22, formed of the elastomeric material, such as to thrust upper portions of the semiconductor chip 3 and the capacitors 4a to 4d against the glass substrate 1 at a pre-set pressure. The filet part of the adhesive on the lateral sides of the semiconductor chip 3 and the capacitors 4a to 4d may be thrust with a pressure smaller than that applied to the upper parts of the semiconductor chip and the capacitors. In this manner, a sufficient pressure may be applied to the connection portions of the semiconductor chip 3 and the capacitors 4a to 4d to the printed circuit board 1, while a pressure may be applied to the filet part around the semiconductor chip 3 and the capacitors 4a to 4d such as not to produce voids in the filet part.

Figure 5:
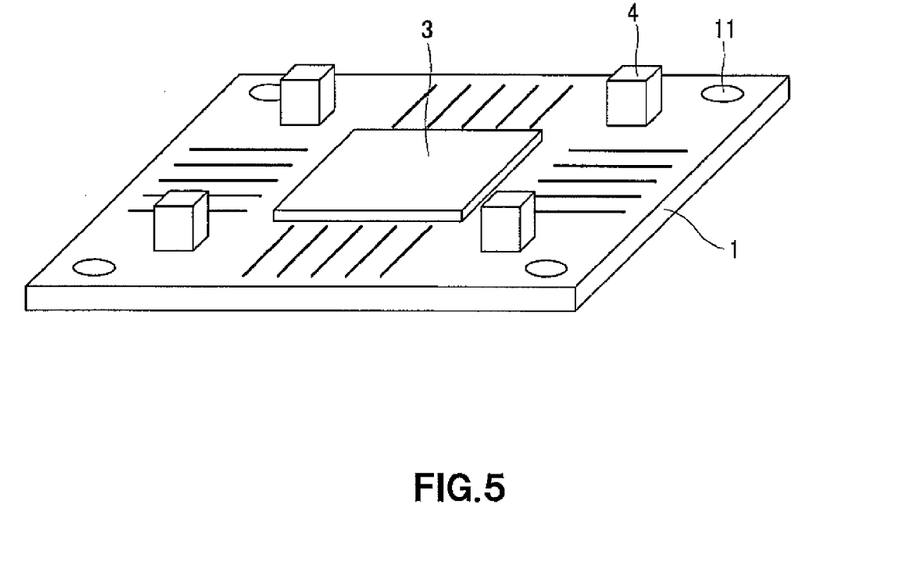
FIG. 5 is a schematic perspective view showing an example configuration of the composite unit.

In this manner, there is obtained a semiconductor device in which the semiconductor chip 3 and the capacitors 4a to 4d differing in height from each other are packaged in lump to high density, as shown in FIG. 5. Viz., with the EBS process, each packaging process (providing an adhesive, temporary attachment and ultimate pressure bonding), performed so far for each of the semiconductor chip 3 and the capacitors 4a to 4d, may be carried out at a time. In addition, connection reliability in the case of using the NCF 2 may be improved. In particular, in case of lump packaging of a plurality of semiconductor chips on the same substrate by the EBS process, variations in the curing states from one semiconductor chip to another may be suppressed by the NCF 2 of the present mode. It is thus possible to achieve packaging to high density and to high connection reliability.

Although the EBS process of lump packaging of electronic components has been described in the above mode, the present invention is not limited to this configuration. Viz., in case the NCF in the present mode is used for flipchip connection, excellent connection reliability may be achieved. In this case, the NCF may be bonded to the semiconductor chip, instead of providing the NCF on the printed circuit board before pressure bonding as in the above described EBS process.

Initially, an NCF is bonded to a circuit surface of a semiconductor wafer, such as Si wafer, on which there are already formed a plurality of semiconductor chips. The semiconductor chips are then singulated in the dicing process to form a semiconductor chip having formed thereon an NCF of the same size as the chip surface. Since the NCF of the present mode is excellent in transparency, alignment marks may be recognized with ease to allow for cutting the semiconductor chips to high accuracy.

The semiconductor chip, carrying thereon the NCF, is packaged on the printed circuit board in the next following packaging process. Specifically, a plurality of electronic components, inclusive of the semiconductor chip, on which the NCF has been formed in the dicing process, are temporarily loaded on the printed circuit board. These electronic components are then thrust by a thermal pressuring head having a thrust surface of an elastomeric material that covers up the above mentioned printed circuit board, thus ultimately pressure-bonding the electronic components. In this manner, a plurality of electronic components may be mounted in lump.

EXAMPLE

Several Examples of the present invention will now be described. In the present Examples, epoxy resin compositions were prepared to evaluate their alignment mark recognition performance, tight bonding performance, connection resistance and connection resistance following the reliability test. It is noted that the present invention is not limited to these Examples.

Example 1

20 parts by weight of an acrylic elastomer, containing EA (ethyl acrylate)-AN (acrylonitrile)-GMA (glycidyl methacrylate)-DMMA (dimethylacrylamide)-HEMA (hydroxyethyl methacrylate) as main monomers (manufactured by Nagase Chemtex Corporation under the trade name of SG-80H-3), 100 parts by weight of an epoxy resin (70 parts by weight of EPIKOTE 1031S, a trade named of a product manufactured by JER Corporation, and 30 parts by weight of EPIKOTE 604, a trade named of a product manufactured by JER Corporation), 70 parts by weight (in teems of an equivalent) of a novolak phenolic curing agent FenoliteTD-2131 (trade name), manufactured by DIC Corporation, 2 parts by weight of a curing accelerator 2E4Mz (trade name), manufactured by Shikoku Chemicals Corporation) and 10 parts by weight of an inorganic filler RY200 (trade name), manufactured by Nippon Aerosil) were kneaded in a kneader to form an epoxy resin composition. This epoxy resin composition was added by toluene to form a resin solution with the concentration of solid contents of 50%. This resin solution was coated, using a bar coater, on a release film processed for releasing (a film of polyethylene terephthalate (PET)). The resulting product was charged into an oven heated at 80° C. to volatilize toluene to produce an NCF film 25 μm in thickness. Two of the NCF films, each 25 μm in thickness, were bonded together to an NCF of Example 1 which was 50 μm in thickness. Table 1 shows the formulation of the epoxy resin composition forming the NCF of Example 1.

Example 2

An epoxy resin composition was prepared in the same way as in Example 1 except changing the amount of the inorganic filler RY200, manufactured by Nippon Aerosyl, to 5 parts by weight, to yield the NCF of Example 2. Table 1 shows the formulation of the epoxy resin composition that forms the NCF of Example 2.

Example 3

An epoxy resin composition was prepared in the same way as in Example 1 except changing the amount of the acrylic elastomer containing EA (ethyl acrylate)-AN (acrylonitrile)-GMA (glycidyl methacrylate)-DMMA (dimethylacrylamide)-HEMA (hydroxyethyl methacrylate) as main monomers (manufactured by Nagase Chemtex Corporation under the trade name of SG-80H-3), to 30 parts by weight, to yield an NCF of Example 3. Table 1 shows the formulation of the epoxy resin composition that forms the NCF of Example 3.

Example 4

An epoxy resin composition was prepared in the same way as in Example 1 except changing the amount of the acrylic elastomer containing EA (ethyl acrylate)-AN (acrylonitrile)-GMA (glycidyl methacrylate)-DMMA (dimethylacrylamide)-HEMA (hydroxyethyl methacrylate) as main monomers (manufactured by Nagase Chemtex Corporation under the trade name of SG-80H-3), to 40 parts by weight, to yield an NCF of Example 4. Table 1 shows the formulation of the epoxy resin composition that forms the NCF of Example 4.

Example 5

An epoxy resin composition was prepared in the same way as in Example 1 except further adding an epoxy-based silane coupling agent A187 (a trade name of a product manufactured by Momentive Performance Materials) to obtain an NCF of Example 5. Table 1 shows the formulation of the epoxy resin composition that forms the NCF of Example 5.

Comparative Example 1

An epoxy resin composition was prepared in the same way as in Example 1 except adding 70 parts by weight of an imidazole-based curing agent (capsulated imidazole) (Novacure HP3941, a trade name of a product manufactured by Asahi Kasei Chemicals Corp), in place of the novolak phenolic curing agent, and not adding the curing accelerator, to yield an NCF of Comparative Example 1. Table 1 shows the formulation of the epoxy resin composition that forms the NCF of the Comparative Example 1.

Comparative Example 2

An epoxy resin composition was prepared in the same way as in Example 1 except adding 20 parts by weight of an acrylic elastomer containing BA (butyl acrylate)-EA (ethyl acrylate)-AN (acrylonitrile)-GMA (glycidyl methacrylate) as main monomers, to yield an NCF of Comparative Example 2. Table 1 shows the formulation of the epoxy resin composition forming the NCF of Comparative Example 2.

Comparative Example 3

An epoxy resin composition was prepared in the same way as in Example 1 except adding a phenoxy resin (YP50, a trade name of a product manufactured by (Tohto Kasei Co. Ltd.), to yield an NCF of Comparative Example 3. Table 1 shows the formulation of the epoxy resin composition that forms an NCF of Comparative Example 3.

Comparative Example 4

An epoxy resin composition was prepared in the same way as in Example 1 except not adding the inorganic filler to yield an NCF of Comparative Example 4. Table 1 shows the formulation of the epoxy resin composition that forms the NCF of Comparative Example 4.

Comparative Example 5

An epoxy resin composition was prepared in the same way as in Example 1 except adding 20 parts by weight of the inorganic filler RY200, a trade name of a product manufactured by Nippon Aerosyl, to yield an NCF of Comparative Example 5. Table 1 shows the formulation of the epoxy resin composition that forms the NCF of Comparative Example 5.

[Alignment Mark Recognition Performance]

Figure 6:
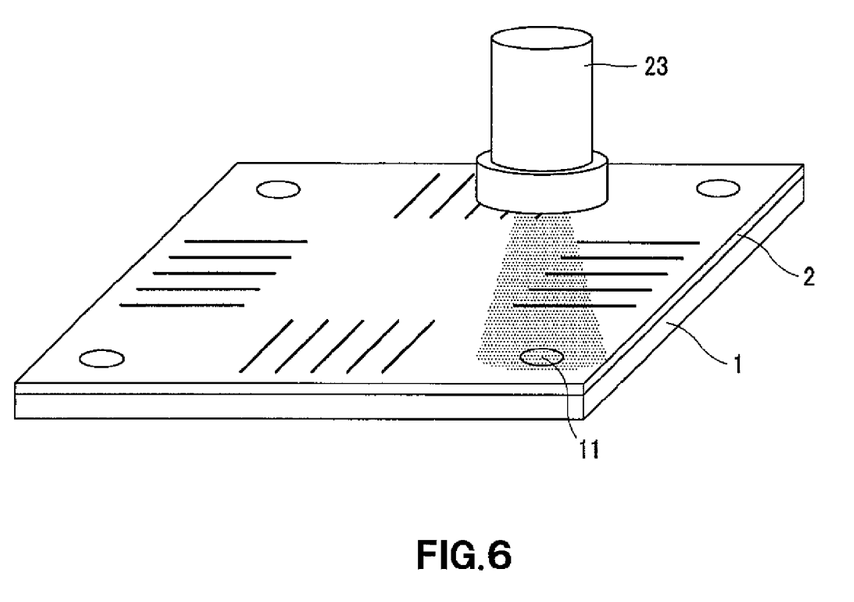
FIG. 6 is a schematic perspective view for illustrating the method for evaluating the alignment mark recognition performance.

Any one of the NCFs of Examples 1 to 5 and Comparative Examples 1 to 5 was arranged on the printed circuit board 1, as shown in FIG. 6. An alignment mark 11, 300 μm in diameter, was imaged with a camera 23 from the distance of 10 mm.

Table 1 shows the results of evaluation of alignment mark recognition performance. In Table 1, the NCFs with the ratio of success in recognition of the alignment marks 11 in the image photographed being 95% or higher were marked ○, while those with the ratio of success being less than 95% were marked X.

[Tight Bonding Performance]

Using the NCF 2, a semiconductor chip 3 was packaged on the printed circuit board 1. As the NCF 2, the NCFs of the Examples 1 to 5 and the Comparative Examples 1 to 5 were used. For the printed circuit board 1, a polyimide film, 25 μm in thickness, was used. As the semiconductor chip 3, such a chip 6.3 mm long, 6.3 mm wide and 0.3 mm thick, provided with gold stud bumps, was used.

Figure 7:
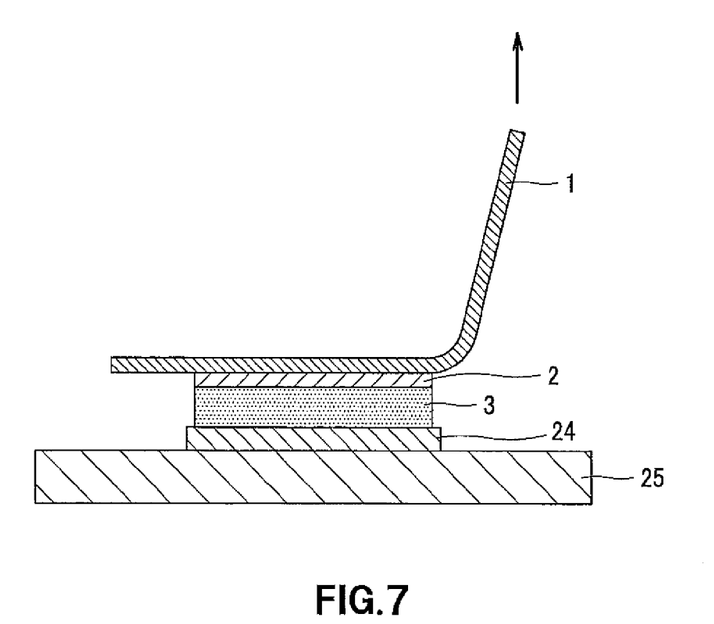
FIG. 7 is a schematic perspective view for illustrating the method for evaluating the tight bonding performance.

A composite unit was immobilized on a glass substrate 25, using an epoxy-based adhesive 24, as shown in FIG. 7. The polyimide film was pulled at a rate of 30 mm/min to measure the bonding strength of the NCF (N/cm).

Table 1 shows the results of evaluation of the tight bonding performance. In this Table 1, the NCFs with a bonding strength of not lower than 5 N/cm are marked ◉, the NCFs with a bonding strength of less than 5 N/cm and not less than 1 N/cm are marked ○, and the NCFs with a bonding strength of less than 1 N/cm are marked X.

[Initial Connection Resistance]

The semiconductor chip 3 was packaged on the printed circuit board 1. As the NCF 2, those of the Examples 1 to 5 and the Comparative Example 1 to 5 were used.

Figure 8:
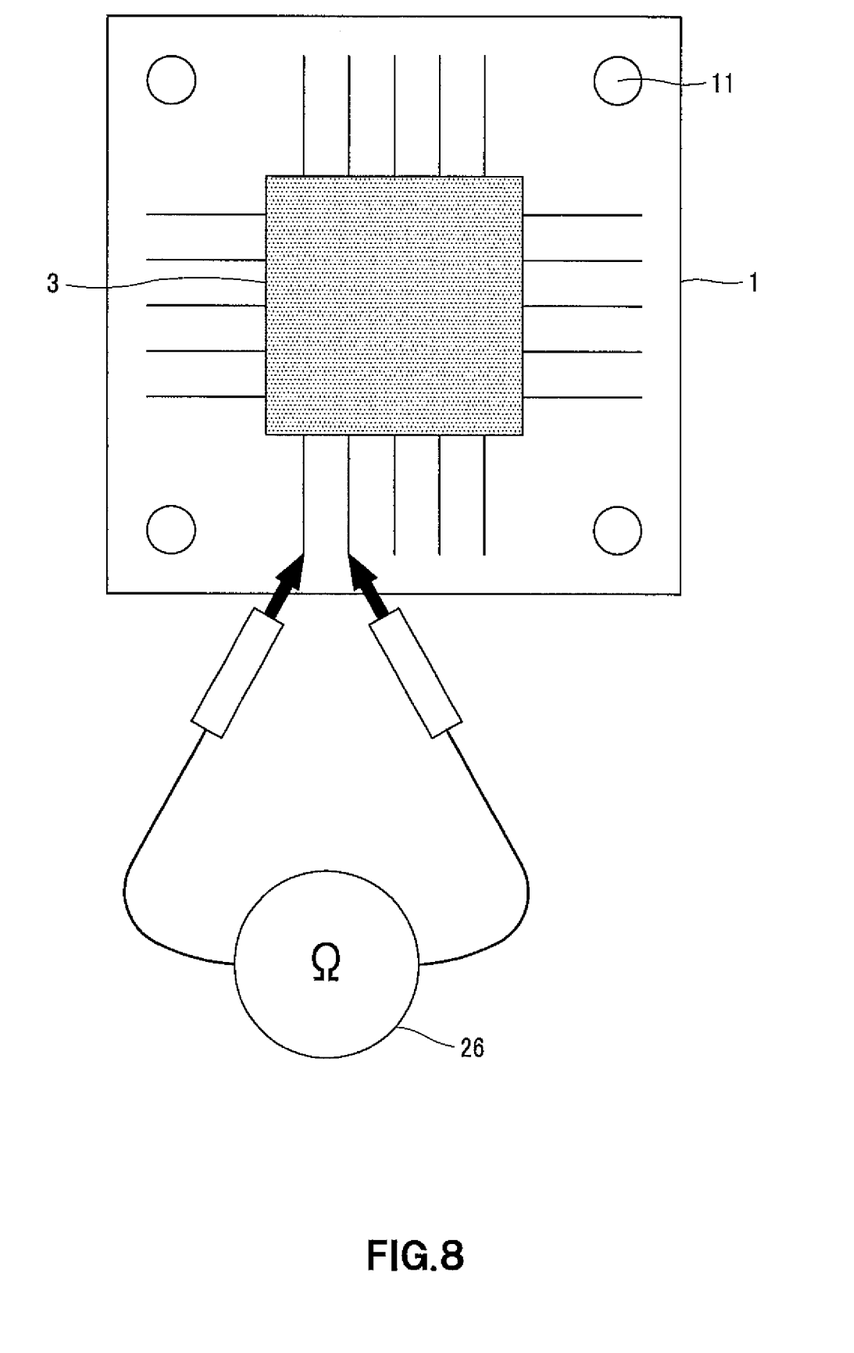
FIG. 8 is a schematic top plan view for illustrating the method for evaluating the connection resistance.

The values of the initial connection resistance of the printed circuit board 1 and the semiconductor chip 3 of the composite unit were measured using a resistance measurement unit 26, as shown in FIG. 8.

Table 1 shows the results of evaluation of the connection resistance. In this Table 1, the NCFs with the initial connection resistance not greater than 10 mΩ were marked ○, and those with the initial connection resistance exceeding 10 mΩ were marked X.

[Connection Resistance following Reliability Test]

The semiconductor chip 3 was packaged on the printed circuit board 1 using the NCF 2. As the NCFs, those of the Examples 1 to 5 and the Comparative Examples 1 to 5 were used. Specifically, the NCF was placed on the electrodes of the printed circuit board and heated/pressured using the EBS (240° C., 40 seconds, 10 kg/semiconductor chip, stage heating), thereby packaging the semiconductor chip on the printed circuit board. As the elastic material for the EBS, silicone rubber with the rubber hardness of 40 was used.

A PCT (Pressure Cooker Test: 121° C.×saturation (100% RH)×96 h) and TCT (Cooling/Heating Cyclic Test: −55° C. to 125° C.×700 cycles) were conducted for this composite unit, after which the connection resistance was measured as shown in FIG. 8 for comparison with the initial connection resistance.

Table 1 shows the results of evaluation of the connection resistance following the reliability test. In this Table 1, those NCFs in which changes in resistance values from the initial connection resistance to the connection resistance following the reliability test are 2 mΩ or less are marked ◉, those NCFs where the changes in resistance values are more than 2 mΩ and not more than 5 mΩ are marked ○, those NCFs where the changes in resistance values are more than 5 mΩ and not more than 10 mΩ are marked Δ and those NCFs where the changes in resistance values are more than 10 mΩ are marked X.

TABLE 1

| | components of formulation | Ex. 1 | Ex. 2 | Ex. 3 | Ex. 4 | Ex. 5 | Comp Ex. 1 | Comp. Ex. 2 | Comp. Ex. 3 | Comp. Ex. 4 | Comp Ex. 5 |
|---|---|---|---|---|---|---|---|---|---|---|---|
| phenoxy resin | YP50 (Tohto Kasei Co. Ltd.) | — | — | — | — | — | — | — | 20 | — | — |
| acrylic elastomer | SG-80H-3 (EA-AN-GMA-DMAA-HEMA) (Nagase Chemtex Corporation) | 20 | 20 | 30 | 40 | 20 | 20 | — | — | 20 | 20 |
| | (BA-EA-AN-GMA) | — | — | — | — | — | — | 20 | — | — | — |
| epoxy resins | EPIKOTE 1031S (manufactured by J E R Corporation) | 70 | 70 | 70 | 70 | 70 | 70 | 70 | 70 | 70 | 70 |
| | EPIKOTE 604 (manufactured by J E R Corporation) | 30 | 30 | 30 | 30 | 30 | 30 | 30 | 30 | 30 | 30 |
| novolak phenolic curing agent | phenolite TD-2131 (manufactured by DIC Corporation) | 70 | 70 | 70 | 70 | 70 | — | 70 | 70 | 70 | 70 |
| imidazole-based curing agent (capsulated imidazole) | Novacure HP3941 (manufactured by Asahi Kasei Chemicals Corp.) | — | — | — | — | — | 70 | — | — | — | — |
| curing accelerator | 2E4MZ (manufactured by Shikoku Chemicals Corporation) | 2 | 2 | 2 | 2 | 2 | — | 2 | 2 | 2 | 2 |
| inorganic filler | RY200 (manufactured by NIPPON Aerosyl) | 10 | 5 | 10 | 10 | 10 | 10 | 10 | 10 | — | 20 |
| epoxy-based silane coupling agent | A187 (Momentive Performance Materials) | — | — | — | — | 2 | — | — | — | — | — |
| total | | 202 | 197 | 212 | 222 | 204 | 200 | 202 | 202 | 192 | 212 |
| evaluation items | alignment mark recognition performance | ○ | ○ | ○ | ○ | ○ | ○ | X | ○ | ○ | X |
| | tight bonding performance | ○ | ○ | ○ | ○ | ◉ | ○ | — | X | ○ | — |
| | initial connection resistance | ○ | ○ | ○ | ○ | ○ | X | — | X | ○ | — |
| | connection resistance following reliability test | ○ | ○ | ○ | Δ | ◉ | X | — | X | X | — |

[Results of Evaluation]

The results of evaluation, shown in Table 1, indicate that, with the Example 1 which uses the novolak phenolic curing agent, the tight bonding performance as well as the connection resistance following the reliability test was excellent in comparison with Comparative Example 1 which uses the imidazole based curing agent. The reason is thought to be such that, with the novolak phenolic curing agent, as compared to the imidazole based curing agent, the initiation reaction (the behavior of the curing agent attacking the epoxy ring) is sluggish such that variations in the curing behavior are lesser.

The Examples 1 to 5 use EA-AN-GMA-DMMA-HEMA random copolymers, thus including dimethyl acrylamide (DMMA) and hydroxyethyl methacrylate (HEMA), as an acrylic elastomer. In these Examples, compatibility to the epoxy resin is higher than in the Comparative Example 2 which uses the BA-EA-AN-GMA random copolymer. In addition, in the Examples 1 to 5, the alignment mark recognition performance is higher than that of the Comparative Example 2.

Figure 9:
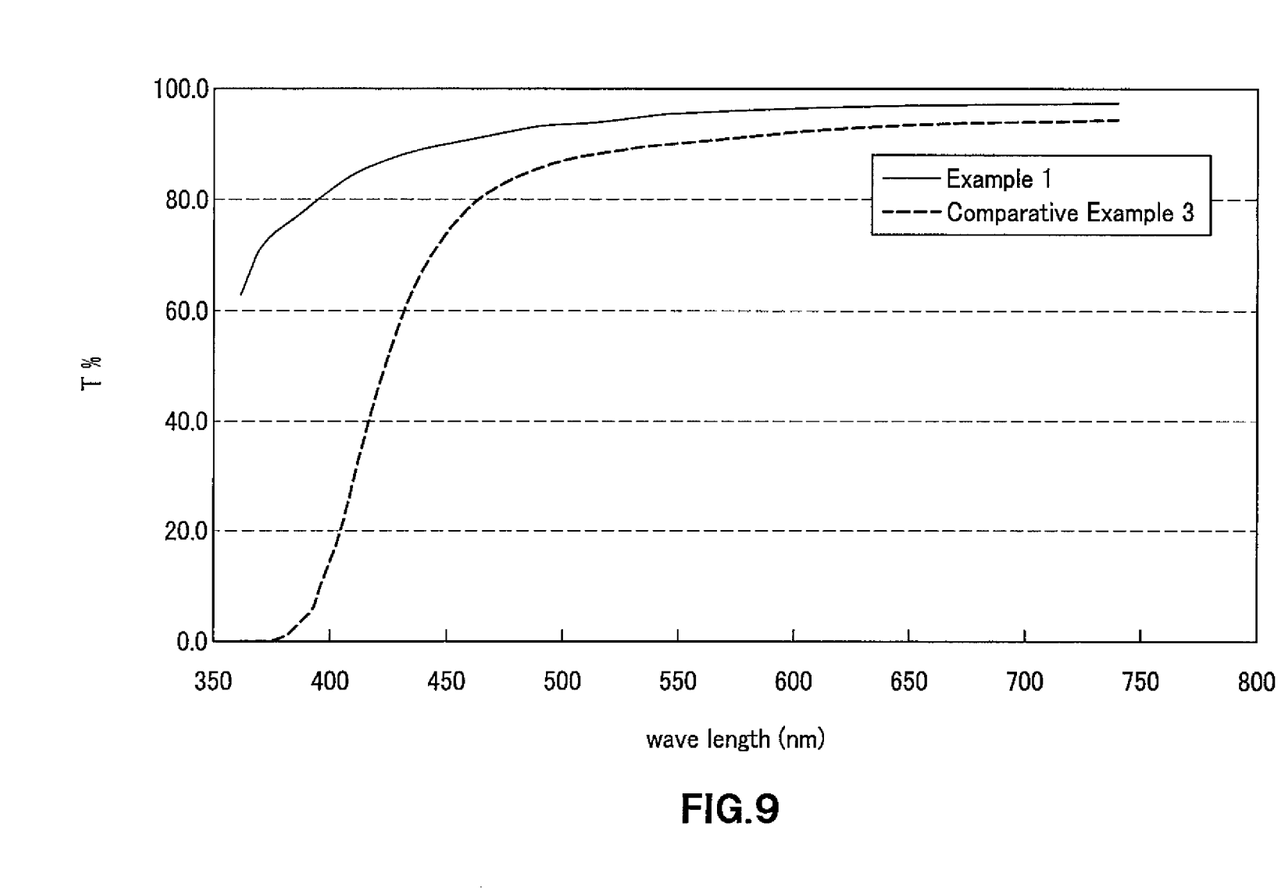
FIG. 9 is a graph showing the results of measurement of transmittance of the epoxy resin composition.

FIG. 9 depicts a graph showing measured results of transmittance of the NCFs of Example 1 and Comparative Example 3. It is noted that the transmittance indicated is of a value re-calculated in terms of 35 μm thickness. For both the Example 1 and Comparative Example 3, the alignment mark recognition performance is excellent, as shown in Table 1. However, it may now be seen that the NCF of Example 1 which uses the EA-AN-GMA-DMMA-HEMA random copolymers exhibits high transmittance even to light rays of short wavelengths.

Figure 10:
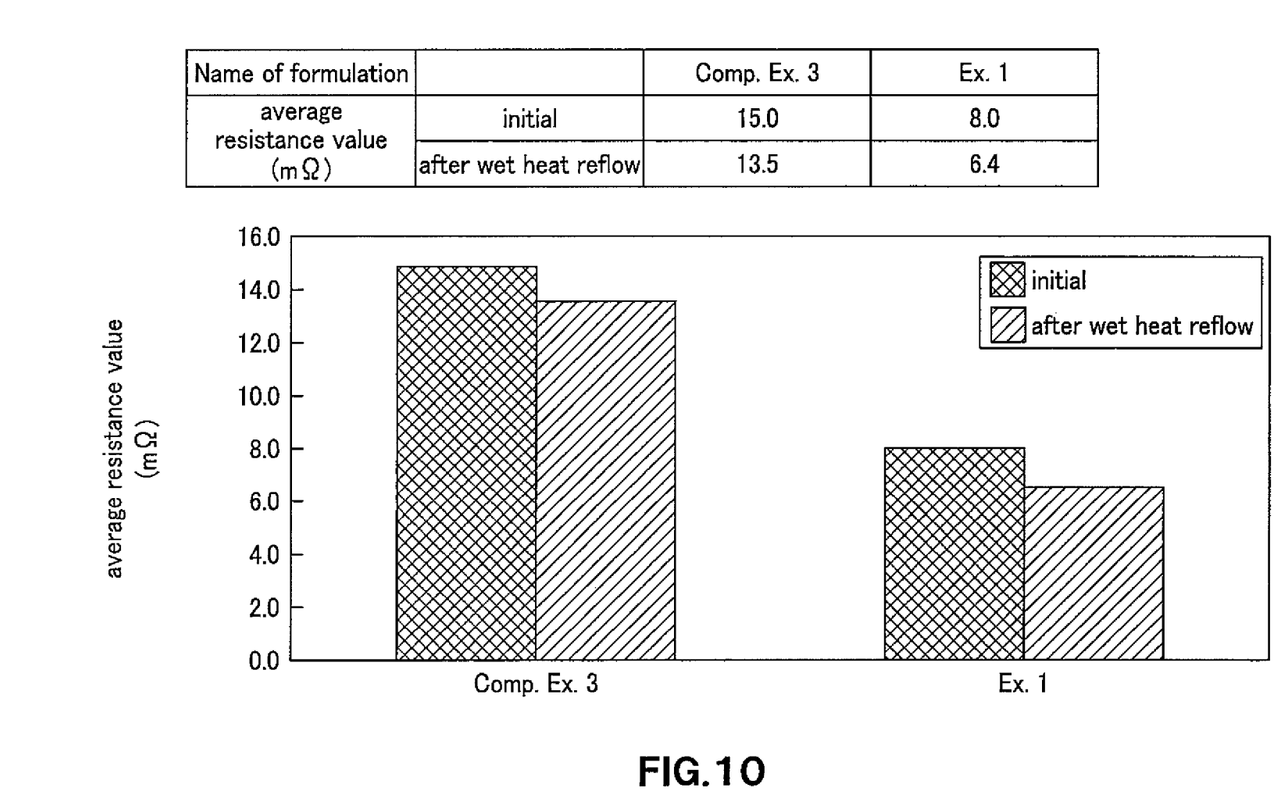
FIG. 10 is a graph for illustrating the initial connection resistance and the connection resistance prevailing after the wet heat reflow of the epoxy resin composition.

FIG. 10 depicts a graph showing initial connection resistance and connection resistance following wet heat reflow of NCFs of Example 1 and Comparative Example 3. It is seen from this graph that, even after wet heat reflow, the connection resistance not greater than 10 mΩ could not be obtained with the Comparative Example 3 which uses the phenoxy resin.

Viz., it was found that excellent alignment mark recognition performance, tight bonding performance and connection reliability could be obtained with the use of the EA-AN-GMA-DMMA-HEMA random copolymers.

It was also found that connection resistance following the reliability test could be increased by increasing the relative contents of the acrylic elastomer to the epoxy resin as in Examples 3 and 4. Viz., it was found that excellent alignment mark recognition performance, tight bonding performance and connection reliability could be obtained in case the acrylic elastomer was contained in an amount of 20 to 40 parts by weight to 100 parts by weight of the epoxy resin.

In the Comparative Example 4, not containing inorganic fillers, connection resistance following the reliability test is inferior. In the Comparative Example 5 containing 20 parts by weight of the inorganic fillers to 100 parts by weight of the epoxy resin, the resin itself is lowered in transparency, while the alignment mark recognition performance becomes inferior. Viz., it was found that excellent alignment mark recognition performance, tight bonding performance and connection reliability could be obtained in case not less than 5 parts by weight and not greater than 20 parts by weight of the inorganic fillers are contained to 100 parts by weight of the epoxy resin.

It was also found that connection resistance following the reliability test could further be improved by adding the epoxy based silane coupling agent as in Example 5.

An IC chip including a solder cap on a copper pillar (an IC chip including a Cu pillar/Sn2.5Ag bump structure) was tentatively used in place of an IC chip of Examples 1 to 5 including gold stud bumps. Even in this case, connection reliability was found to be excellent.

The invention claimed is:

1. An epoxy resin composition containing a novolak phenolic curing agent, an acrylic elastomer, an epoxy resin and an inorganic filler, wherein,
   the acrylic elastomer is composed of a copolymer containing dimethylacrylamide and hydroxyethyl methacrylate; and wherein
   the inorganic filler is contained in an amount of not less than 5 parts by weight to not more than 20 parts by weight to 100 parts by weight of the epoxy resin.

2. The epoxy resin composition according to claim 1, wherein,
   the acrylic elastomer is contained in an amount of 20 to 40 parts by weight to 100 parts by weight of the epoxy resin.

3. The epoxy resin composition according to claim 1, further containing
   an epoxy-based silane coupling agent.

4. The epoxy resin composition according to claim 1, wherein,
   the formulation ratio of dimethylacrylamide to hydroxyethyl methacrylate in the acrylic elastomer is 5:1 to 3:1.

5. A method for producing a composite unit comprising the steps of
   attaching, on a printed circuit board, an epoxy resin composition containing a novolak phenolic curing agent, an acrylic elastomer composed of a copolymer containing dimethylacrylamide and hydroxyethyl methacrylate, an epoxy resin, and not less than 5 parts by weight to not more than 20 parts by weight of an inorganic filler to 100 parts by weight of the epoxy resin, on a substrate of a printed circuit board in the form of a sheet;
   a temporary loading step of temporarily loading an electronic component on the epoxy resin composition; and
   an ultimate pressure bonding step of pressuring the electronic component by a thermal bonding head in situ to ultimately pressure bond the electronic component.

6. The method for producing a composite unit according to claim 5, wherein,
   the acrylic elastomer is contained in an amount of 20 to 40 parts by weight to 100 parts by weight of the epoxy resin.

7. The method for producing a composite unit according to claim 5, wherein,
   the electronic component is a semiconductor chip.

8. The method for producing a composite unit according to claim 5, wherein,
   the thermal pressure bonding head includes a pressuring surface formed of an elastomer that covers up the printed circuit board;
   the temporary loading step placing a plurality of electronic components differing in height on the printed circuit board; and
   the ultimate pressure bonding step pressuring the plurality of the electronic components by the pressuring surface to package the electronic components in lump.

9. A composite unit composed by an electronic component and a printed circuit board bonded together by an epoxy resin composition;
   the epoxy resin composition containing a novolak phenolic curing agent, an acrylic elastomer composed of a copolymer containing dimethylacrylamide and hydroxyethyl methacrylate, an epoxy resin, and not less than 5 parts by weight to not more than 20 parts by weight of an inorganic filler to 100 parts by weight of the epoxy resin.

10. The composite unit according to claim 9, wherein,
the acrylic elastomer is contained in an amount of 20 to 40 parts by weight to 100 parts by weight of the epoxy resin.

11. A method for producing a composite unit comprising the steps of
attaching an epoxy resin composition containing a novolak phenolic curing agent, an acrylic elastomer composed of a copolymer containing dimethylacrylamide and hydroxyethyl methacrylate, an epoxy resin and not less than 5 parts by weight to not more than 20 parts by weight of an inorganic filler to 100 parts by weight of the epoxy resin, on a circuit surface of a semiconductor wafer carrying thereon a plurality of semiconductor chips, in the form of a sheet, then dicing the wafer to form a singulated semiconductor chip; and
packaging the singulated semiconductor chip, on which the epoxy resin composition has been bonded in the form of the sheet, on a printed circuit board.

12. The method of producing the composite unit according to claim 11, wherein, in the packaging step, the plurality of the electronic components, including the semiconductor chip, the epoxy resin composition has been attached to, are temporarily loaded; and wherein the plurality of the electronic components are pressured by a thermal pressure bonding head having a pressuring surface of an elastomer that covers up the printed circuit board in its entirety to ultimately pressure bond the electronic components in situ.

13. The epoxy resin composition according to claim 2, further containing
an epoxy-based silane coupling agent.

14. The epoxy resin composition according to claim 2, wherein,
the formulation ratio of dimethylacrylamide to hydroxydiethyl methacrylate in the acrylic elastomer is 5:1 to 3:1.

15. The method for producing a composite unit according to claim 6, wherein,
the electronic component is a semiconductor chip.

16. The method for producing a composite unit according to claim 6, wherein,
the thermal pressure bonding head includes a pressuring surface formed of an elastomer that covers up the printed circuit board;
the temporary loading step placing a plurality of electronic components differing in height on the printed circuit board; and
the ultimate pressure bonding step pressuring the plurality of the electronic components by the pressuring surface to package the electronic components in lump.

* * * * *

UNITED STATES PATENT AND TRADEMARK OFFICE
CERTIFICATE OF CORRECTION

PATENT NO. : 8,802,776 B2  
APPLICATION NO. : 13/517415  
DATED : August 12, 2014  
INVENTOR(S) : Taichi Koyama et al.

Page 1 of 1

It is certified that error appears in the above-identified patent and that said Letters Patent is hereby corrected as shown below:

On the Title Page

Under item (30) Foreign Application Priority Data, add --July 28, 2010 (JP) 2010-169711--.

Under item (30) Foreign Application Priority Data, add --December 2, 2010 (JP) 2010-269421--.

Signed and Sealed this  
Fourteenth Day of April, 2015

Michelle K. Lee  
*Director of the United States Patent and Trademark Office*